(12) United States Patent
Chang et al.

(10) Patent No.: US 11,454,251 B1
(45) Date of Patent: Sep. 27, 2022

(54) INTEGRATED DESIGN OF COMPACT AND CABLE HARNESS FAN GUARD

(71) Applicant: Quanta Computer Inc., Taoyuan (TW)

(72) Inventors: Chun Chang, Taoyuan (TW);
Ting-Kuang Pao, Taoyuan (TW);
Yu-Syuan Lin, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 17/234,704

(22) Filed: Apr. 19, 2021

(51) Int. Cl.
*H05K 7/20* (2006.01)
*F04D 29/60* (2006.01)

(52) U.S. Cl.
CPC ....... *F04D 29/601* (2013.01); *H05K 7/20718* (2013.01)

(58) Field of Classification Search
CPC .............. F04D 29/601; H05K 7/20718; H05K 7/20172; G06F 1/20
See application file for complete search history.

(56) References Cited

U.S. PATENT DOCUMENTS

| | | | | |
|---|---|---|---|---|
| 6,826,048 B1 * | 11/2004 | Dean | ................. | H05K 7/20172 165/122 |
| 8,300,411 B2 * | 10/2012 | Tang | ................. | H05K 7/20172 415/214.1 |
| 8,379,387 B2 * | 2/2013 | Chuang | .............. | H05K 7/20172 415/213.1 |
| 2012/0156030 A1 * | 6/2012 | Shu | ........................... | G06F 1/20 415/213.1 |
| 2012/0163971 A1 * | 6/2012 | Chiu | ...................... | F04D 29/522 415/213.1 |
| 2013/0101410 A1 * | 4/2013 | Tan | .......................... | G06F 1/20 415/213.1 |
| 2013/0108435 A1 * | 5/2013 | Zhou | ........................ | G06F 1/20 415/213.1 |
| 2014/0178222 A1 * | 6/2014 | Hou | ...................... | F04D 29/646 417/423.15 |
| 2014/0241875 A1 * | 8/2014 | Tsai | ........................ | F04D 25/08 415/213.1 |
| 2015/0282384 A1 * | 10/2015 | Ho | ............................ | F16B 2/22 24/485 |
| 2020/0318654 A1 * | 10/2020 | Hsieh | .................... | F04D 29/083 |

* cited by examiner

*Primary Examiner* — Abhishek M Rathod
(74) *Attorney, Agent, or Firm* — Nixon Peabody LLP

(57) ABSTRACT

A fan module holder for holding a fan module generating air flow is disclosed. The holder includes a base, a first wall and a second wall, and a plurality of hooks. The first wall and the second wall extend from opposite ends of the base. The plurality of hooks extends from a top section of the first wall and the second wall and is configured to secure a cooling system. A plurality of apertures is formed as a vent in the first wall. Each of the plurality of hooks includes a protrusion extending therefrom. The second wall includes a cutout. The fan module abuts the base, the first wall, and the second wall of the holder when the holder is in an installed position. The base is generally rectangular and includes a plurality of cylinders.

17 Claims, 6 Drawing Sheets

INTEGRATED DESIGN OF COMPACT AND CABLE HARNESS FAN GUARD

FIELD OF THE INVENTION

The present invention relates generally to a device for cooling computing system components, and more specifically, to a mechanism for holding a fan module in a fixed position.

BACKGROUND OF THE INVENTION

Cooling systems, such as fan systems within computing systems, typically have a set of fan modules. The fan modules may include fan guards to minimize exposure of fan blades to the outside environment and to protect a user's fingers from making contact with moving fan blades. The fan guards, and their fastening components, increase the overall size of the fan modules. The increased size of the fan modules takes up extra space in the computing system, where other system components may be placed. Having more space improves the flexibility and options for server system design.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, a fan module holder for holding a fan module generating air flow is disclosed. The holder includes a base, a first wall and a second wall, and a plurality of hooks. The first wall and the second wall extend from opposite ends of the base. The plurality of hooks extends from a top section of the first wall and the second wall. The plurality of hooks is configured to secure a cooling system.

According to a configuration of the above implementation, a plurality of apertures is formed as a vent in the first wall.

According to another configuration of the above implementation, each of the plurality of hooks includes a protrusion extending therefrom.

In a further aspect of the above implementation, the second wall includes a notch.

In another aspect of the above implementation, the fan module abuts the base, the first wall, and the second wall of the holder when the holder is in an installed position.

According to another configuration of the above implementation, the base is generally rectangular and includes a plurality of cylinders.

In a further aspect of the above implementation, at least one of the plurality of cylinders is configured to be coupled to a pin.

In yet a further aspect of the above implementation, the holder is fabricated from a plastic material.

Another aspect of the present disclosure includes a cooling assembly. The cooling assembly includes a fan module and a fan module holder. The fan module is operable to generate air flow. The fan module holder includes a base, a first wall and a second wall, and a plurality of hooks. The first wall and the second wall extend from opposite ends of the base. The plurality of hooks extends from a top section of the first wall and the second wall. The plurality of hooks is configured to secure a cooling system.

According to a configuration of the above implementation, a plurality of apertures is formed as a vent in the first wall.

According to another configuration of the above implementation, each of the plurality of hooks includes a protrusion extending therefrom.

In a further aspect of the above implementation, the second wall includes a notch.

In another aspect of the above implementation, the cooling system abuts the base, the first wall, and the second wall of the holder when the holder is in an installed position.

According to another configuration of the above implementation, the base is generally rectangular and includes a plurality of cylinders.

In a further aspect of the above implementation, at least one of the plurality of cylinders is configured to be coupled to a pin.

In yet a further aspect of the above implementation, the holder is fabricated from a plastic material.

Another aspect of the present disclosure includes a computing system. The computing system includes an electronic component and a cooling assembly. The electronic component generates heat. The cooling assembly is adjacent to the electronic component. The cooling assembly includes a fan module and a fan module holder. The fan module is operable to generate air flow. The fan module holder includes a base, a first wall and a second wall, and a plurality of hooks. The first wall and the second wall extend from opposite ends of the base. The plurality of hooks extends from a top section of the first wall and the second wall. The plurality of hooks is configured to secure a cooling system.

According to a configuration of the above implementation, a plurality of apertures is formed as a vent in the first wall.

According to another configuration of the above implementation, each of the plurality of hooks includes a protrusion extending therefrom.

In a further aspect of the above implementation, the second wall includes a notch.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

DETAILED DESCRIPTION

Figure 1:
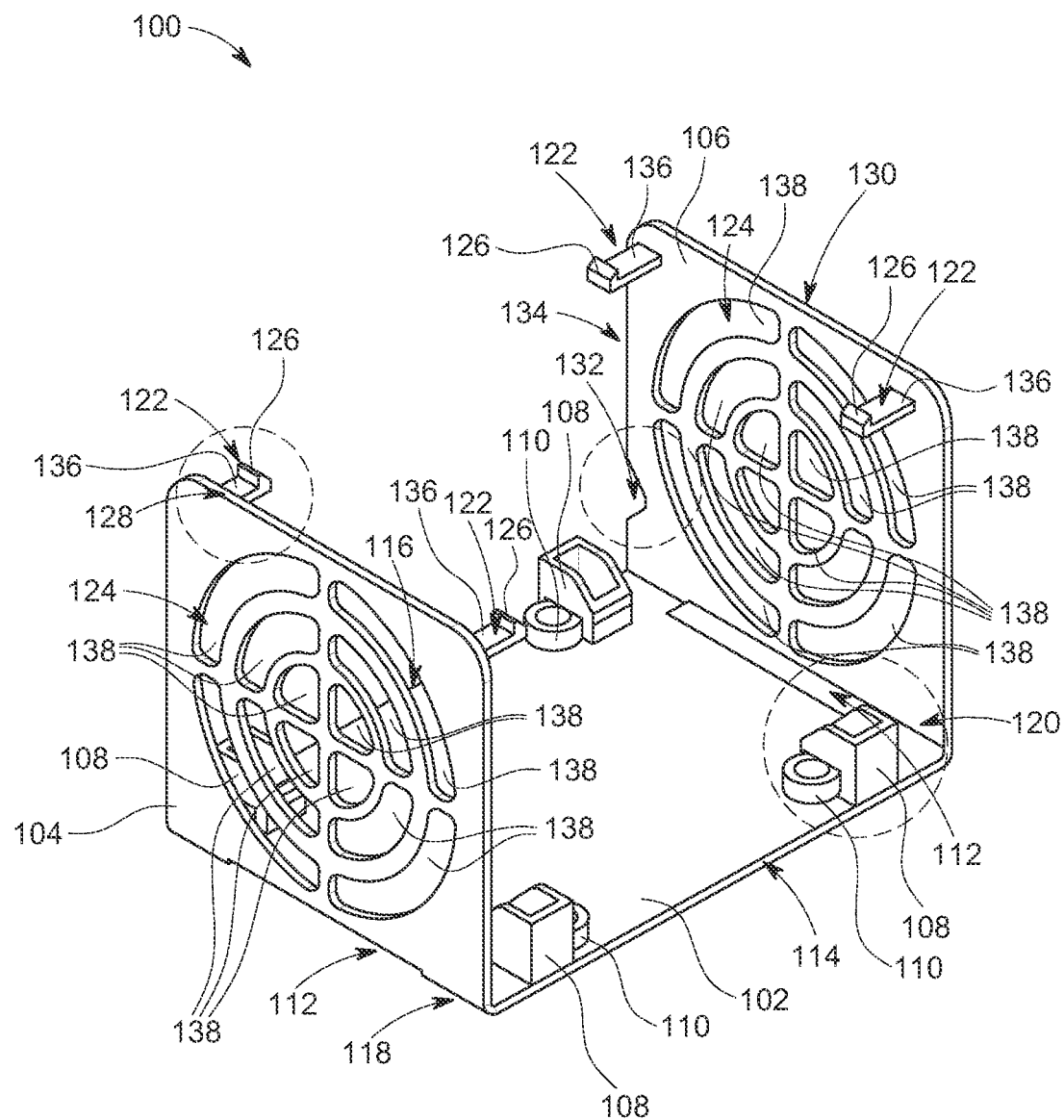
FIG. 1 is a perspective top view of a fan holder, according to certain aspects of the present disclosure.

The present disclosure is directed to a device for cooling components of a computing system using a fan module. More specifically, the present disclosure is related to a fan holder that minimizes the overall size of the fan module in the computing system.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

FIG. 1 is a perspective top view of a fan holder 100. The fan holder 100 may be used in conjunction with a fan module in a computing system, such as a server system. Computing systems typically include multiple components within a chassis, such as a processor, memory modules, a power supply, connection ports, and a motherboard. The individual components in the computing system may produce dissipate, generate, produce, or radiate heat. Thus, the heat in the system may accumulate if a cooling mechanism is not implemented. The fan holder 100 may hold a fan module used to cool the temperature in a computing system. The fan holder 100 may be placed within the computing system, as will be described herein.

The fan holder 100 may include a base 102, a first wall 104, and a second wall 106. The base 102 is approximately perpendicular to the first wall 104 and the second wall 106. The first wall 104 and the second wall 106 are approximately parallel to each other. In the implementation shown in FIG. 1, the fan holder 100 is made of a plastic having high thermal resistance, such as, but not limited to, polycarbonate, acrylonitrile butadiene styrene, polyimide, polyoxymethylene, polyvinyl chloride, polytetrafluoroethylene, polyamide-imide, polypropylene, polyphenylene sulfide, polyphenylene oxide, polyethylene, polyurethane, and polystyrene. In other implementations, the fan holder 100 may be made of a different material, such as a metal or rubber.

The base 102 includes stoppers 108, hollow cylinders 110 adjacent to the stoppers 108, slits 112, a first edge 114, a second edge 116, a third edge 118, and fourth edge 120. Each of the stoppers 108 contact respective registration features of a fan module once the fan module is installed into the fan holder 100. The stoppers 108 protrude from the corners of the base 102 and may be fabricated from the same material as the base 102. Alternatively, the stoppers 108 may be permanently or temporarily coupled to the base 102 after the base 102 is fabricated, such as by an adhesive or through heat treatment. In this implementation, the stopper 108 has a generally rectangular cross-section. The stopper 108 forms a space for insertion of the corresponding registration feature of a fan module. In other implementations, the stopper 108 may have a different cross-section, such as circular or triangular, and may not have any corners cut off. The stoppers 108 are generally located along the first edge 114 and the second edge 116 of the base 102. In this implementation, at least one portion of each stopper 108 abuts either the first edge 114 or the second edge 116 of the base 102. There are four stoppers 108; however, in other implementations, there may be more or less than four stoppers 108.

In this implementation, there are three hollow cylinders 110 on the base 102 that extend through the base 102 or abut a circular surface on the base 102. In other implementations, there may be more or less than three cylinders 110 depending on the number of cylinders 110 used to couple the fan holder 100 to the chassis. The cylinders 110 may have different shapes than a circle, such as a rectangle or a triangle. The cylinders 110 are generally located near the first edge 114 or the second edge 116 of the base 102. The cylinders 110 are also generally located adjacent to the stoppers 108. The cylinders 110 include a hole that extends through the base 102 and allows a fastener to attach the base 102 to a chassis. Protrusions, such as pins or nails, in the chassis of the computing system may be inserted in the holes of the cylinders 110. Thus, the cylinders 110 secure the fan holder 100 to the chassis.

In this implementation, the two slits 112 are generally rectangular in shape. In other implementations, the slits 112 may have a different shape of varying sizes, and there may be more than one slit 112 on each side of the fan holder 100. The slits 112 generally extend lengthwise between the first edge 114 and the second edge 116. In this implementation, the slits 112 are located on either the third edge 118 or the fourth edge 120 of the base 102. The slits 112 allow the first wall 104 and the second wall 106 to bend away relative to the base 102 from an upright position along the third edge 118 and the fourth edge 120, respectively, without separating or breaking. The slits 112 provide stress relief in the material of the base 102 to allow the walls 104 and 106 to bend at a greater angle than without the slits 112. Thus, the first wall 104 and the second wall 106 may bend away from the base 102 without tearing, ripping, or breaking. Thus, the slits 112 allow the first wall 104 and the second wall 106 of the fan holder 100 to exhibit more ductility and flexibility.

The first wall 104 of the base 102 includes two hooks 122, a vent 124, and a first wall top portion 128. In this implementation, there are two hooks 122 with a generally rectangular cross-section protruding from the first wall 104. The hooks 122 have a support member 136 that includes a protrusion 126 extending from the support member 136 at one end. The protrusion 126 extends from the support member 136 of the hook 122 at an opposite end from the first wall 104. The hooks 122, the support members 136, and the protrusions 126 secure the fan holder 100 to a fan module, as will be described herein. The hooks 122 are generally positioned near the first wall top portion 128. In this implementation, the hooks 122 do not abut the first wall top portion 128.

In this implementation, the vent 124 has apertures 138 that are arranged in a circular pattern to form the vent 124 that is aligned with the circular shape of an exhaust of a fan module. Each aperture 138 in the vent 124 is generally an arc shape, with each aperture 138 having three additional approximately equally-sized components rotated from each other approximately ninety degrees relative to the center of the arc of the aperture 138. Each component makes up a quarter or one-fourth of the circle of the circular pattern arrangement. Also, in the circular pattern, there are approximately three concentric, overlaid circular-patterned sections. Thus in this implementation, there are twelve apertures 138 in the vent 124, comprised of three circular-patterned components, and broken up into four quarters. As such, on the first wall 104, the four quarters of the vent 124 are located on each of four approximate quarters on the first wall 104. The hollow cylinders 110 also leave circular material attached to the quarter separations of the first wall 104.

The second wall 106 of the base 102 includes two hooks 122, a vent 124, a second wall top portion 130. Like the first wall 104, there are two hooks 122 with a generally rectangular cross-section protruding from the second wall 106. The hooks 122 have a support member 136 that includes a protrusion 126 extending from the support member 136 at one end. The protrusion 126 extends from the support member 136 of the hook 122 at an opposite end from the second wall 106. The hooks 122, the support members 136, and the protrusions 126 secure the fan holder 100 to a fan module, as will be described herein. The hooks 122 are generally positioned near the first wall top portion 128. In this implementation, the hooks 122 do not abut the second wall top portion 130.

Like the first wall 104, in this implementation, the vent 124 is arranged in a circular pattern in the second wall 106. Each aperture 138 in the vent 124 is generally an arc shape, with each aperture 138 having three additional approximately equally-sized components rotated from each other approximately ninety degrees relative to the center of the arc of the aperture 138. Each component makes up a quarter or one-fourth of the circle of the circular pattern arrangement. Also in the circular pattern, there are approximately three concentric, overlaid circular patterned sections. Thus in this implementation, there are twelve apertures 138 in the vent 124, comprised of three circular-patterned components, and broken up into four quarters. As such, on the first wall 104, the four quarters of the vent 124 are located on each of four approximate quarters on the first wall 104. The circular cutouts also leave circular material attached to the quarter separations of the second wall 106.

Additionally, the second wall 106 includes a V-shaped notch 132. The shape of the notch 132 is generally triangular. The notch 132 is located on a right edge 134 of the second wall 106 in this example. In other examples, the notch 132 may be placed on a different edge of the second wall 106 or the first wall 104, and there may be more than one notch 132 on the fan holder 100. The notch 132 is located adjacent to the base 102. The notch 132 provides space for wires or cables to be inserted through the second wall 106 to connect to a fan module installed into the fan holder 100.

Figure 2:
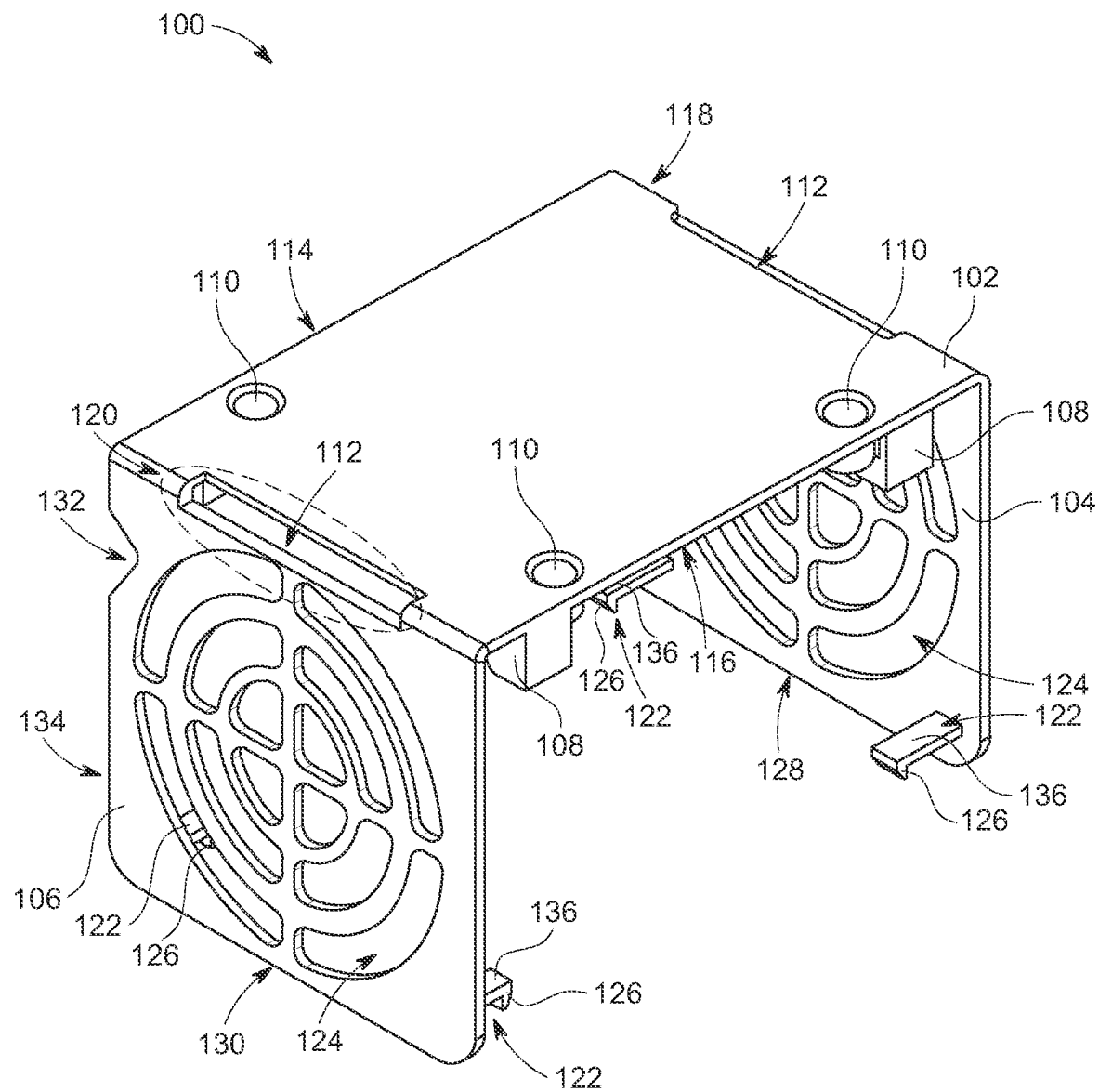
FIG. 2 is a perspective bottom view of the fan holder of FIG. 1.

Referring to FIG. 2, the features of the fan holder 100 can also be seen from a bottom perspective view. More specifically, the cylinders 110 on the base 102 can be seen. The cylinders 110 extend through the base 102 and the through hole for installation of the fan holder 100 to pins of a chassis of a computing system. FIG. 2 shows the rectangular shape of one of the slits 112. The fourth edge 120 is adjacent to the second wall 106 and the base 102. Similarly, the third edge 118 is adjacent to the first wall 104 and the base 102.

Figure 3A:
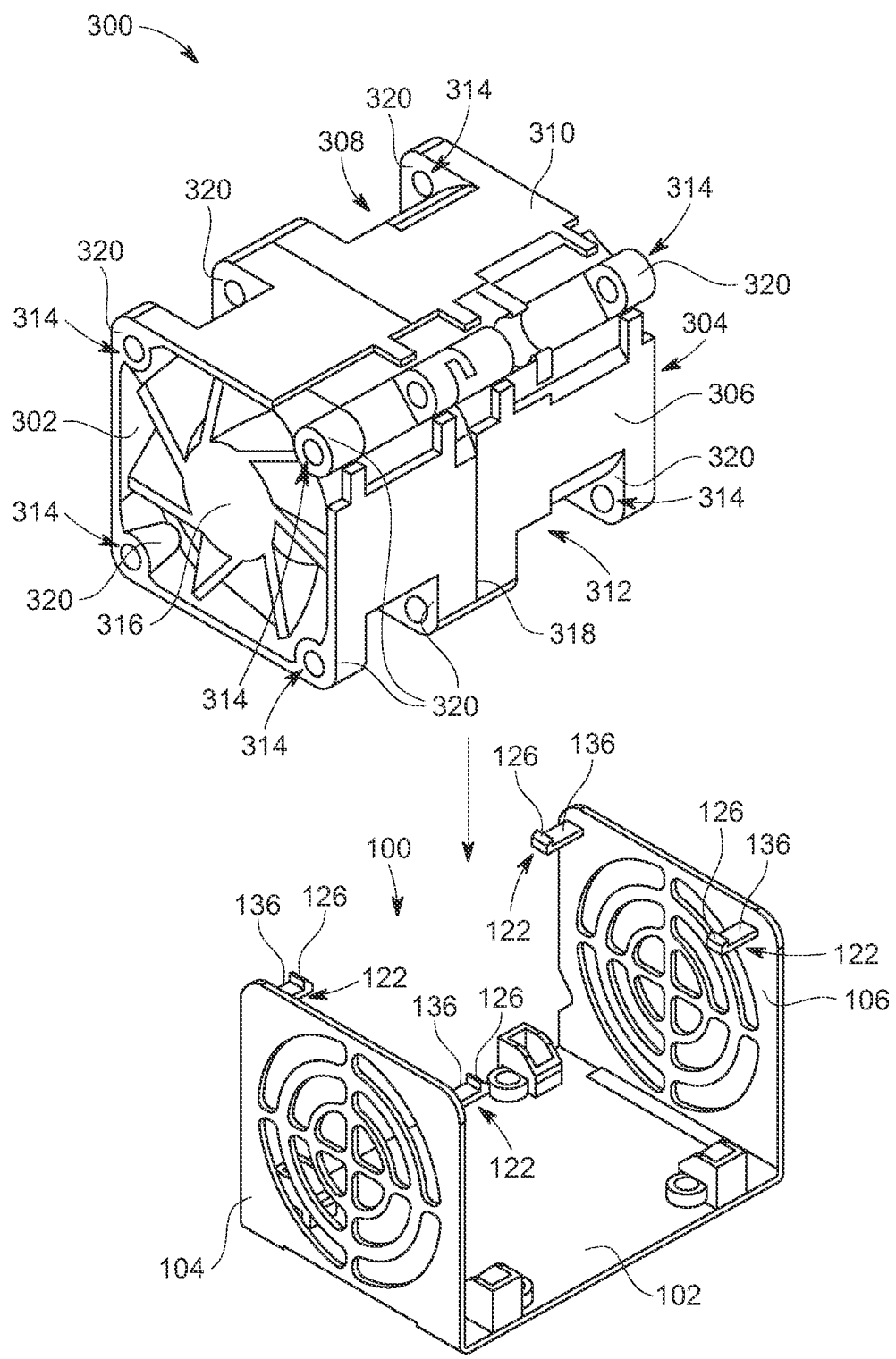
FIG. 3A is a perspective view showing a fan module aligned with the fan holder of FIG. 1 as part of an installation process, according to certain aspects of the present disclosure.
Figure 3B:
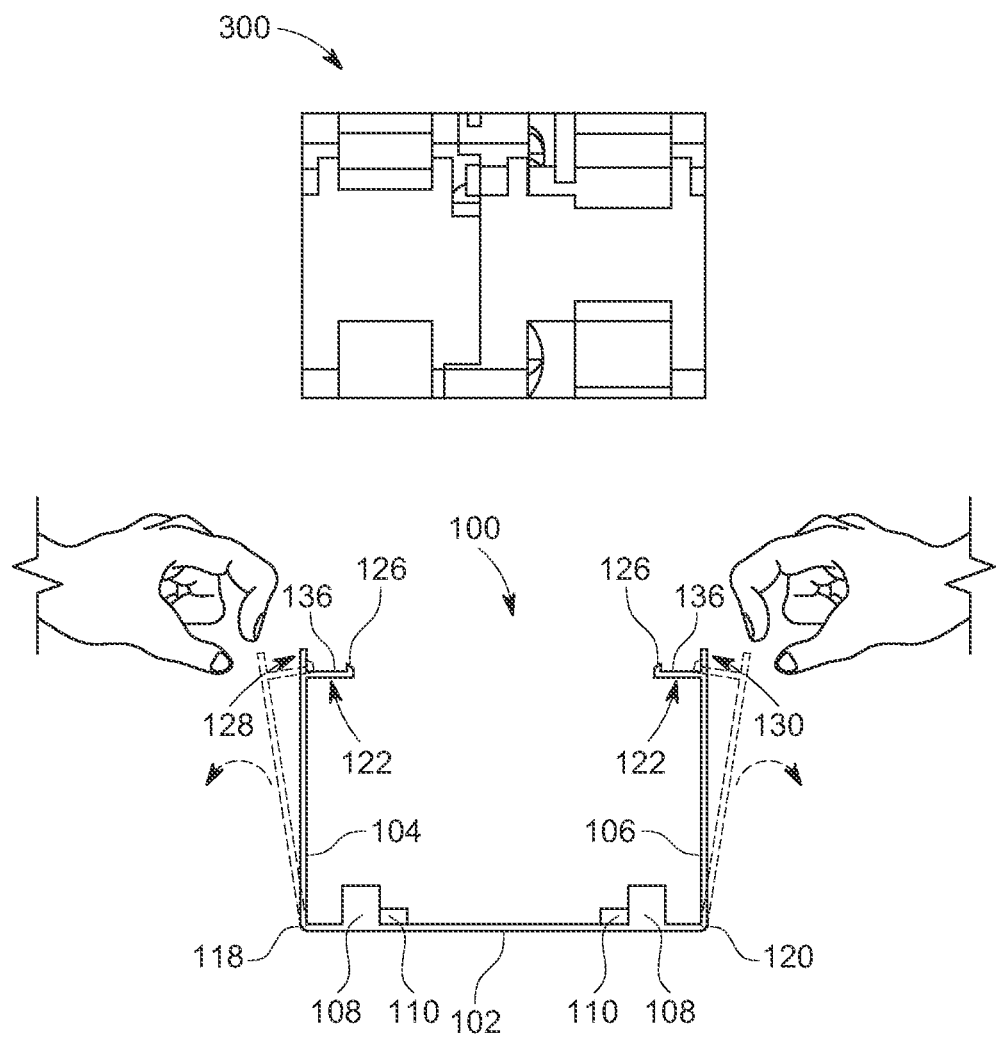
FIG. 3B is a side view showing the fan module and the fan holder aligned as part of the installation process, according to certain aspects of the present disclosure.

FIGS. 3A-3B show a process of installing a fan module 300 into the fan holder 100 in FIGS. 1-2. The fan module 300 includes a first side 302, a second side 304, a third side 306, a fourth side 308, a top side 310, and a bottom side 312. In this implementation, there are four holes 314 on a protruding tab 320 located on each of the first side 302 and the second side 304 of the fan module 300. A plurality of protruding tabs 320 are at the four corners of the first side 302, the second side 304, and a middle side 318. The fan module 300 is a generally rectangular in shape. The holes 314 may be used to stabilize, secure, or fasten the fan module 300. In other implementations, there may be more or less than four holes 314 on each of the plurality of protruding tabs 320 of the first side 302, the second side 304, or the middle side 318 of the fan module 300. A series of blades 316 are connected to a hub in the fan module 300. The hub is connected to a motor allowing the blades 316 to be rotated to generate airflow. The fan module 300 also includes wiring to provide power to the motor of the fan module 300 and cause the blades 316 to rotate, when the fan module 300 is in an activated state.

In this implementation, the first wall 104 of the fan holder 100 is generally aligned with the first side 302 of the fan module 300. Similarly, the second wall 106 is generally aligned with the second side 304, and the base 102 is generally aligned with the bottom side 312. Thus, the first wall 104, the second wall 106, and the base 102 form a support for the fan module 300 to be inserted.

The fan module 300 is first aligned with the fan holder 100, as shown in FIG. 3A. FIG. 3B shows a second step in the process of installing the fan module 300 in the fan holder 100. In the second step, the fan module 300 is positioned with the fan holder 100 such that the first wall 104 is aligned with the first side 302 and the second wall 106 is aligned with the second side 304. A user may use their fingers or a tool to move the first wall 104 such that the first wall top portion 128 tilts away from the base 102 by applying force to the first wall top portion 128 in a direction away from the base 102. At the same time, a user may use their fingers or a tool to move the second wall 106 such that the second wall top portion 130 tilts away from the base 102 by applying force to the second wall top portion 130 away from the base 102. When the first wall 104 and the second wall 106 are pulled away from the base 102, the space between the first wall 104 and the second wall 106 is greater than the length of the fan module 300. Thus, when the force is applied to pull away the first wall 104 and the second wall 106, the fan module 300 may be inserted into the fan holder 100 because the fan holder 100 is in an expanded position. As previously described, the first wall 104 and the second wall 106 may bend relative to the third edge 118 or the fourth edge 120, respectively, without breaking, to increase the distance between the first wall 104 and the second wall 106.

After the fan holder 100 is in the expanded position shown in FIG. 3B, the fan module 300 may be placed within the fan holder 100 such that a bottom side 312 of the fan module 300 abuts the base 102. The fan module 300 may be moved in a downward direction by a user or a tool, placing the fan module 300 within the fan holder 100. The hooks 122 and the protrusions 126 on the first wall 104 and the second wall 106 are extended a distance away from the base 102 such that the fan module 300 may be moved in a downward direction into the fan holder 100 without obstruction. Therefore, the distance between the hooks 122 on the first wall 104 and the hooks 122 on the second wall 106 are greater than the length of the fan module 300, when the fan holder 100 is in the expanded position.

Figure 4A:
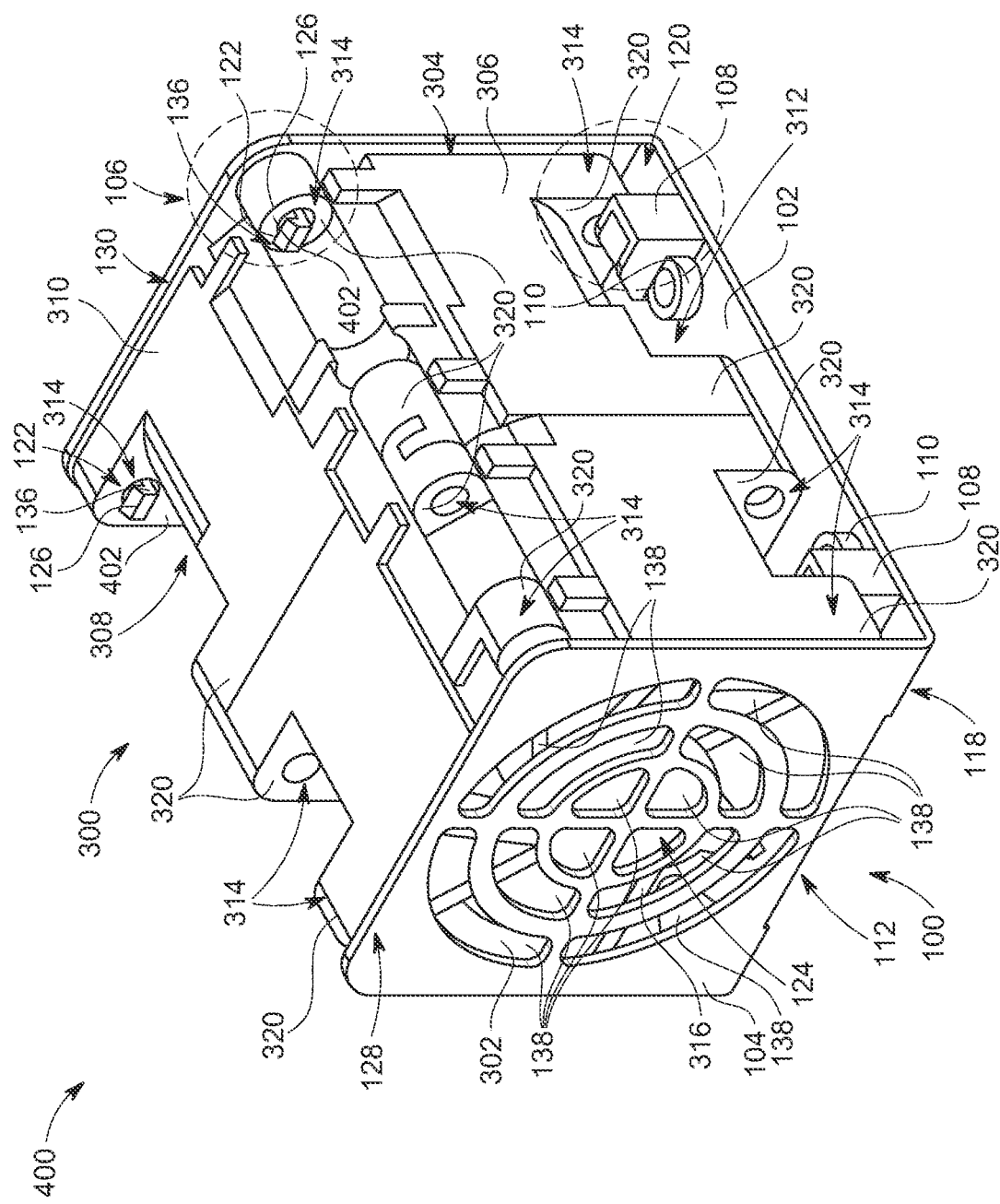
FIG. 4A is a top perspective view showing the fan module in a fan assembly in an installed position, according to certain aspects of the present disclosure.

FIG. 4A shows a fan assembly 400 including the fan holder 100 and the fan module 300. A third, and final step in installing the fan module 300 into the fan holder 100 is ensuring proper alignment of the fan module 300. Once the fan module 300 is placed in the fan holder 100, the user may release the force applied to keep the first wall 104 and the second wall 106 in the position away from the base 102. After the force is released, the first wall 104 of the fan holder 100 snaps back and abuts the first side 302 of the fan module 300, and the second wall 106 snaps back and abuts the second side 304 of the fan module 300. In some implementations, the base 102 does not contact the bottom side 312 of the fan module 300, as the fan module 300 is supported exclusively by the first wall 104 and the second wall 106.

Once aligned, the protruding tabs 320 of the fan module 300 may be positioned between the stoppers 108 and either the first wall 104 or the second wall 106 of the fan holder 100. In this implementation, two protruding tabs 320 nearest to the third edge 118 are located between the first wall 104 and the two stoppers 108 nearest to the first wall 104. Similarly, the two protruding tabs 320 nearest to the fourth edge 120 are located between the stopper 108 and the second wall 106. Thus, each stopper 108 may be designed to support the fan module 300 in the fan holder 100. The user may need to manipulate the position of the first side 302 and the second side 304 of the fan module 300 in order to ensure the positioning of the fan module 300.

Once aligned, the hooks 122 and the protrusions 126 of the first wall 104 (shown in FIGS. 1-3B) of the fan holder 100 may be placed within the holes 314 of the first side 302 of the fan module 300. The user may need to ensure that the hooks 122 and protrusions 126 of the first wall 104 are aligned with the holes 314 on the corresponding side 302 of the fan module 300, before releasing the force in the direction away from the base 102. As such, the user may need to manipulate the hooks 122 or the protrusions 126 to be placed within the hole 314. In this implementation, there are two hooks 122 in the first wall 104 to be placed into the corresponding holes 314 of the fan module 300. Thus, before releasing the pressure applied away from the base 102, the user may need to align both hooks 122 to the respective holes 314. In other implementations, there may be more or less than two hooks 122 on the first wall 104 aligning with the holes 314 on the first side 302. Similarly, the user may apply the same process for ensuring that the hooks 122 and protrusions 126 of the second wall 106 of the fan holder 100 are aligned and mated with the holes 314 on the second side 304 of the fan module 300. The hooks 122 secure the top side 310 and the bottom side 312 of the fan module 300 within the fan holder 100.

In some implementations, the protrusions 126 extend from the first side 302 or the second side 304 and completely extend through the hole 314. In the implementation shown in FIG. 4A, the protrusions 126 abut inner sections 402 of the fan module 300 located on a section opposite from the holes 314. For each hole 314 that has a hook 122 inserted through it, each corresponding inner section 402 makes contact with at least a portion of the protrusion 126 of the hook 122. The purpose of the protrusion 126 may be to keep the fan module 300 in close connection with the fan holder 100 while in the installed position. More specifically, the protrusions 126 of the hooks 122 of the first wall 104 maintain the first side 302 of the fan module 300 near or abutting the first wall 104. Similarly, the protrusions 126 of the hooks 122 of the second wall 106 maintain the second side 304 of the fan module 300 near or abutting the second wall 106.

The user may also easily remove the fan module 300 from the fan holder 100. The process is generally similar to the three previously described steps, except that the user would first need to apply a force to the protrusions 126 such that the protrusions 126 may be pulled back entirely through the holes 314. The user may then pull the first wall 104 and the second wall 106 away from the base 102 until the hooks 122 and the protrusions 126 are no longer inserted in the holes 314. Then, the user may move the fan module 300 in an upward direction such that the distance between the bottom side 314 of the fan module 300 and the base 102 increases and the components are no longer aligned.

Figure 4B:
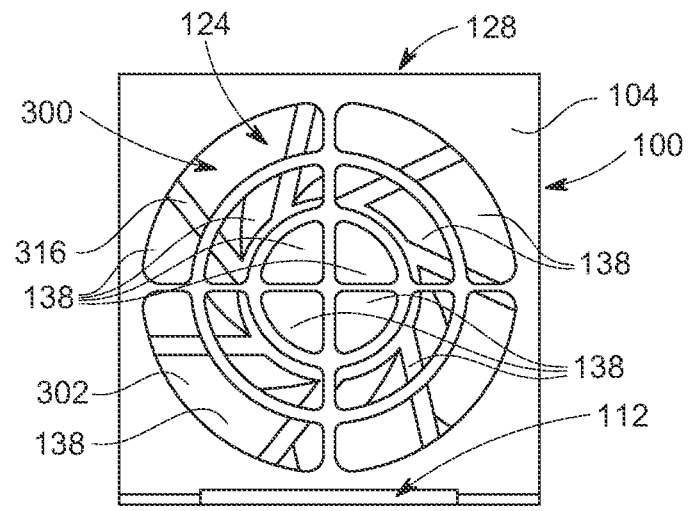
FIG. 4B is a front view showing the fan assembly in an installed position, according to certain aspects of the present disclosure.

Referring to FIG. 4B, the front view of the fan assembly 400 shows the first wall 104 of the fan holder 100 and the first side 302 of the fan module 300. In this implementation, the vent 124 is near the blades 316. The apertures 138 of the vent 124 allow for the transmission of the generated air flow from the rotating blades 316 of the fan module 300. The vent 124 also provides a barrier for the user, such that the user's finger or hand would be less likely to make contact with the blades 316, especially when the blades 316 are rotating while the fan module 300 is active. The vent 124 may also provide a barrier for the other components in the computing system, such that the other components are less likely to come into contact with the blade 316.

Figure 5:
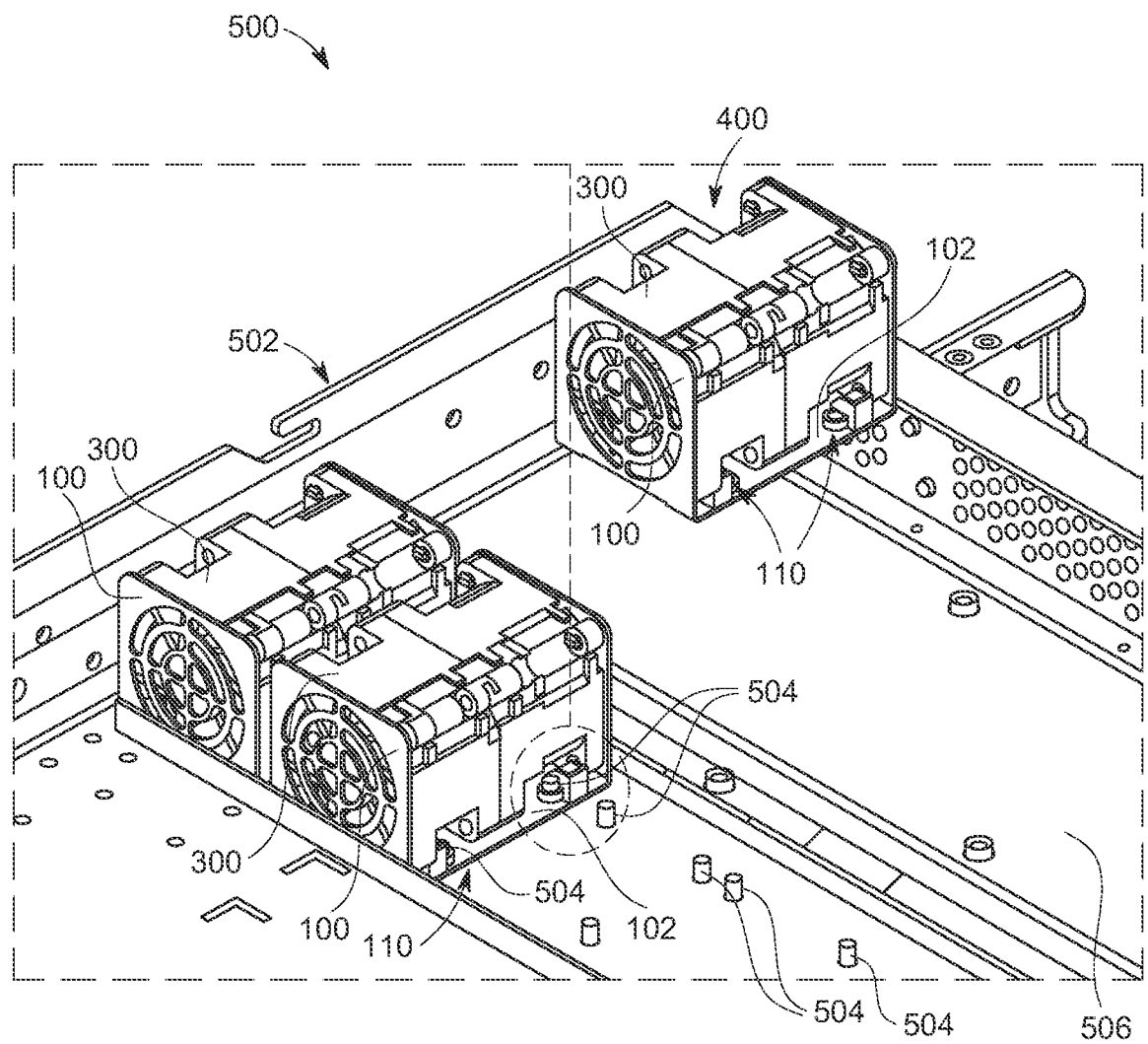
FIG. 5 is a perspective view showing the fan assembly disposed in a server system, according to certain aspects of the present disclosure.

Referring to FIG. 5, the fan assembly 400 may be installed in a chassis 502 of a computing system 500. In this implementation, the cylinders 110 on the base 102 of the fan holder 100 may be mated with any of a series of pins 504 on a bottom portion 506 of the chassis 502. In this implementation, there are three pins 504 aligned with the holes through the three cylinders 110 of the fan holder 100 in each mounting location on the chassis 502. In other implementations, there are more or less than three pins 504 on the chassis 502, as determined by the number of cylinders 110 on the fan holder 100. The pins 504 may also be considered nails, screws, fasteners, dowels, bolts, pegs, or rods. The purpose of the pins 504 is to keep the fan assembly 400 secured within the chassis 502, while minimizing underutilized or unutilized space in the chassis 502. Thus, the arrangement of the fan assemblies 400 in the chassis 502 in this implementation allow for the flexibility of other components to be installed into the chassis 502.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A fan module holder for holding a fan module generating air flow, the holder comprising:
   a base;
   a first wall and a second wall extending from opposite ends of the base;
   the first and second walls each have lower portions which are unitary with the base, and upper portions which are distal of the base; and further that the first and second walls are flexible about the base such that the upper portions of the first and second walls are bendable outwards from the base,
   a plurality of hooks extending from a top section of the first wall and the second wall, the plurality of hooks configured to secure the fan module, and
   a plurality of apertures is formed as a vent in the first wall.

2. The holder of claim 1, wherein each of the plurality of hooks includes a protrusion extending therefrom.

3. The holder of claim 1, wherein the second wall includes a notch.

4. The holder of claim 1, wherein the fan module abuts the base, the first wall, and the second wall of the holder when the holder is in an installed position.

5. The holder of claim 1, wherein the base is generally rectangular and includes a plurality of cylinders.

6. The holder of claim 5, wherein at least one of the plurality of cylinders is configured to be coupled to a pin.

7. The holder of claim 1, wherein the holder is fabricated from a plastic material.

8. A cooling assembly for a computing system, the cooling assembly comprising:
   a fan module operable to generate air flow; and
   a fan module holder comprising: a base; a first wall and a second wall extending from opposite ends of the base;
   the first and second walls each have lower portions which are unitary with the base, and upper portions which are distal of the base; and further that the first and second walls are flexible about the base such that the upper portions of the first and second walls are bendable outwards from the base,
   a plurality of hooks extending from a top section of the first wall and the second wall, the plurality of hooks configured to secure the fan module, and
   a plurality of apertures is formed as a vent in the first wall.

9. The assembly of claim 8, wherein each of the plurality of hooks includes a protrusion extending therefrom.

10. The assembly of claim 8, wherein the second wall includes a notch.

11. The assembly of claim 8, wherein the fan module abuts the base, the first wall, and the second wall of the holder when the holder is in an installed position.

12. The assembly of claim 8, wherein the base is generally rectangular and includes a plurality of cylinders.

13. The assembly of claim 12, wherein at least one of the plurality of cylinders is configured to be coupled to a pin.

14. The assembly of claim 8, wherein the holder is fabricated from a plastic material.

15. A computing system comprising:
    an electronic component generating heat; and
    a cooling assembly adjacent to the electronic component, the cooling assembly comprising:
    a fan module; and
    a fan module holder comprising:
    a base;
    a first wall and a second wall extending from opposite ends of the base;
    the first and second walls each have lower portions which are unitary with the base, and upper portions which are distal of the base; and further that the first and second walls are flexible about the base such that the upper portions of the first and second walls are bendable outwards from the base,
    a plurality of hooks extending from a top section of the first wall and the second wall, the plurality of hooks configured to secure the fan module, and
    a plurality of apertures is formed as a vent in the first wall.

16. The system of claim 15, wherein each of the plurality of hooks includes a protrusion extending therefrom.

17. The system of claim 15, wherein the second wall includes a notch.

* * * * *